(12) United States Patent
Lampe et al.

(10) Patent No.: US 10,561,046 B2
(45) Date of Patent: Feb. 11, 2020

(54) EMC-SHIELDING SEAL AND ELECTRICAL OR ELECTRONIC DEVICE COMPRISING A SEAL

(71) Applicant: SMA Solar Technology AG, Niestetal (DE)

(72) Inventors: Frank Lampe, Guxhagen (DE); Lars Bethke, Goettingen (DE); Jens Dittmar, Morschen-Neumorschen (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/444,251

(22) Filed: Jun. 18, 2019

(65) Prior Publication Data
US 2019/0307027 A1 Oct. 3, 2019

Related U.S. Application Data

(63) Continuation of application No. PCT/EP2018/050850, filed on Jan. 15, 2018.

(30) Foreign Application Priority Data

Jan. 25, 2017 (DE) .......................... 10 2017 101 414

(51) Int. Cl.
*H05K 9/00* (2006.01)
*H05K 5/06* (2006.01)

(52) U.S. Cl.
CPC ........... *H05K 9/0016* (2013.01); *H05K 5/061* (2013.01); *H05K 5/069* (2013.01)

(58) Field of Classification Search
CPC . H05K 9/0016; H05K 9/0018; H01R 13/6584
See application file for complete search history.

(56) References Cited

U.S. PATENT DOCUMENTS 4,864,076 A * 9/1989 Stickney .............. H05K 9/0016
174/355
6,119,305 A * 9/2000 Loveall .................... F16L 5/10
16/2.2

(Continued)

FOREIGN PATENT DOCUMENTS

WO        9746064 A1    12/1997
WO        9747166 A1    12/1997
WO    202014101818 U1    7/2015

OTHER PUBLICATIONS

MTC.; Product Overview; Micro Tech Components GmbH; www.mtc.de.

*Primary Examiner* — Hung V Ngo
(74) *Attorney, Agent, or Firm* — Eschweiler & Potashnik, LLC

(57) ABSTRACT

A seal for an International Protection (IP)-sealing and electromagnetic capability (EMC)-shielding connection between a first housing component and a second housing component of an electrical or electronic device is disclosed. The seal includes an elastomer-containing sealing body and a metallic support that is embedded to some extent in the sealing body. The sealing body and the metallic support are connected to one another in an adhesive and/or form-fitting manner and thus form a material bond, and the metallic support has a plurality of contact segments, which project out of the sealing body and are configured such that the contact segments make electrical contact in resilient fashion with a first boundary surface that is assigned to the first housing component, and a second boundary surface that is assigned to the second housing component, the seal being pressed in between said boundary surfaces in an installed state.

14 Claims, 6 Drawing Sheets

(56) References Cited

U.S. PATENT DOCUMENTS

| | | | | |
|---|---|---|---|---|
| 6,278,617 B1 * | 8/2001 | Yang | ................... | G06F 1/182 |
| | | | | 361/740 |
| 6,534,706 B1 * | 3/2003 | Rapp | ................ | H05K 9/0015 |
| | | | | 174/354 |
| 7,504,590 B2 * | 3/2009 | Ball | ................. | H05K 9/0016 |
| | | | | 174/354 |
| 9,532,490 B2 * | 12/2016 | Bandhu | ............ | H05K 9/0016 |
| 2009/0181554 A1 * | 7/2009 | Chin | ................. | F16J 15/064 |
| | | | | 439/13 |

* cited by examiner

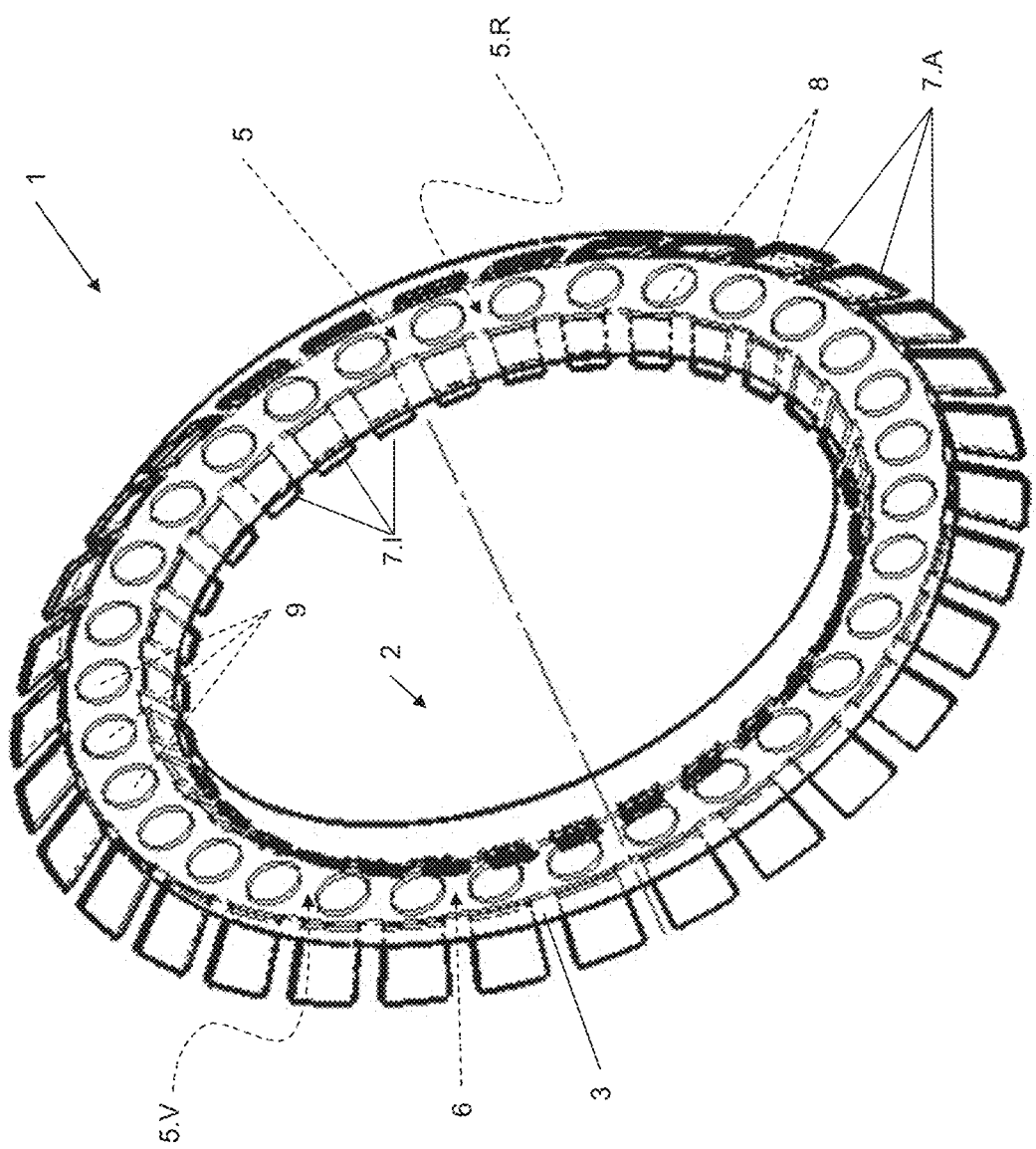

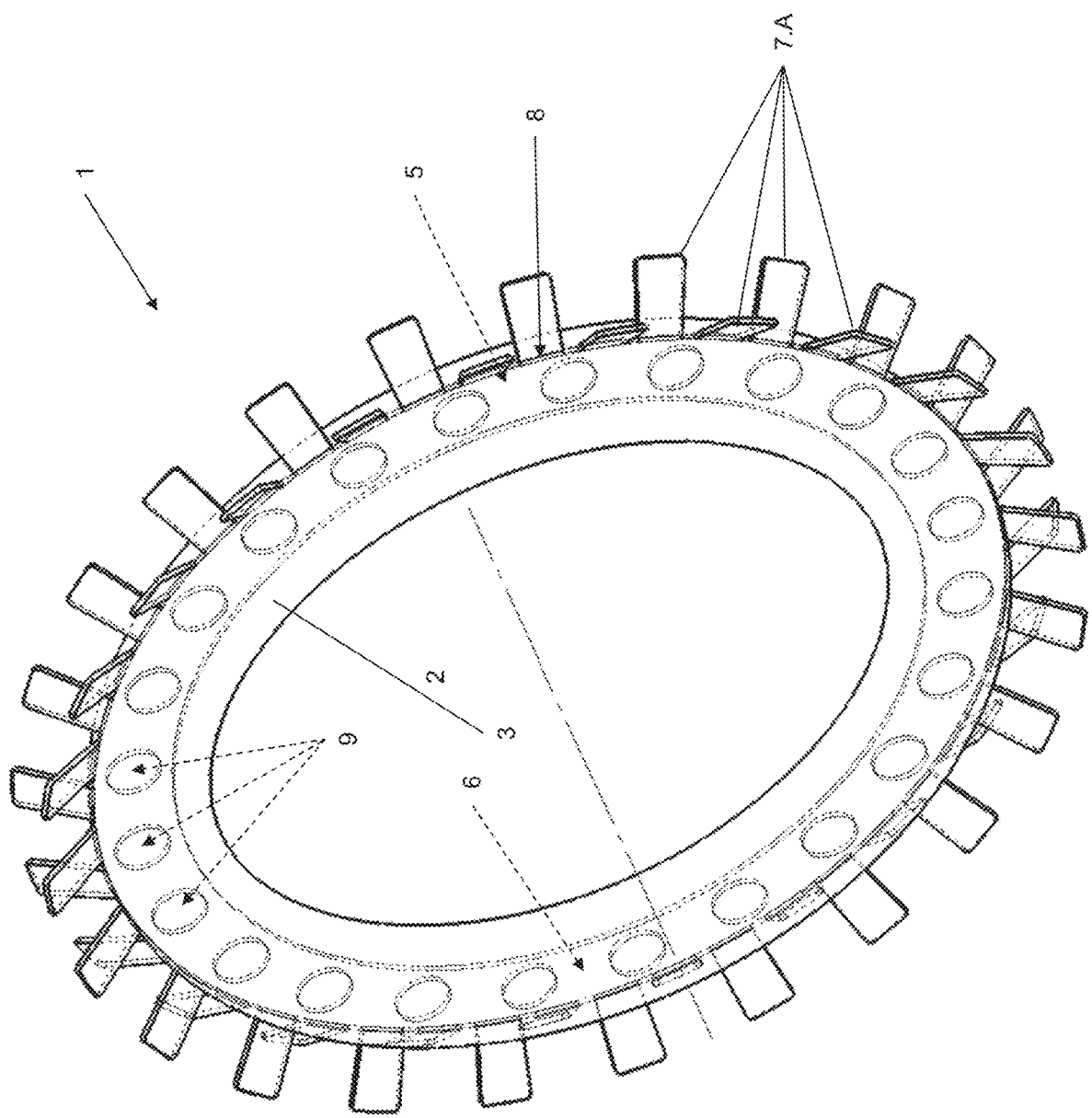

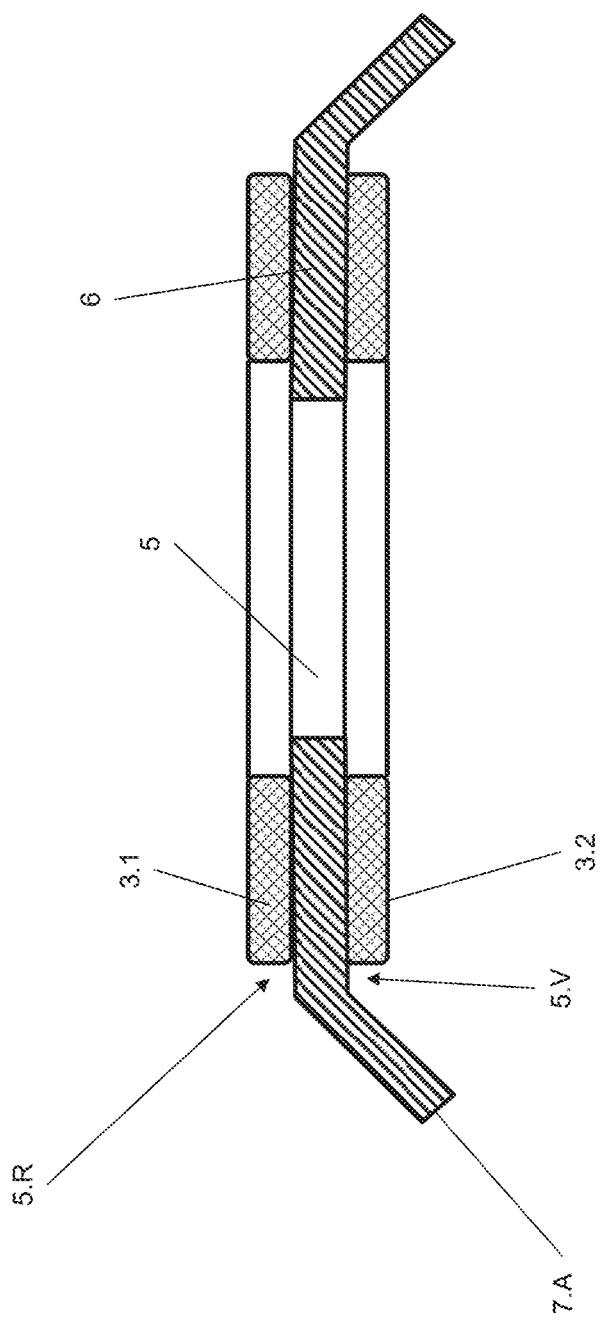

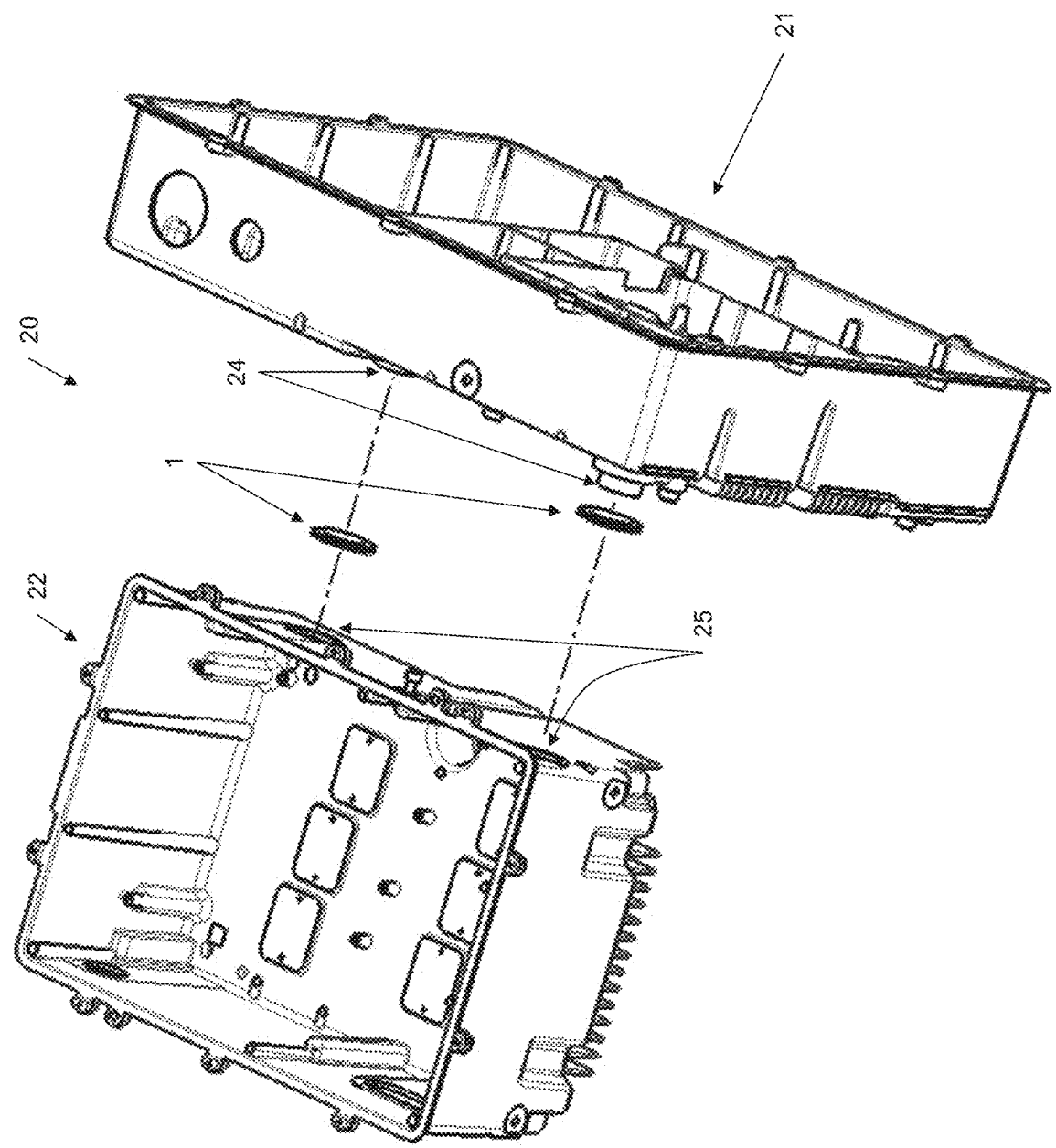

EMC-SHIELDING SEAL AND ELECTRICAL OR ELECTRONIC DEVICE COMPRISING A SEAL

CROSS REFERENCE TO RELATED APPLICATIONS

This application is a continuation of International Patent Application number PCT/EP2018/050850, filed on Jan. 15, 2018, which claims priority to German Patent Application number 10 2017 101 414.4, filed on Jan. 25, 2017, and is hereby incorporated by reference in its entirety.

FIELD

The disclosure relates to a seal for an IP-sealing and EMC-shielding connection between housing components of an electrical or electronic device.

BACKGROUND

Since an electrical or electronic device is made of different housing components, it is possible for each of the housing components to meet different requirements individually. Such a device often has a cost-benefit advantage over a device which contains just one housing component, because in the latter case either the one housing component always has to be designed to compromise between different requirements, which is technically disadvantageous, or an approach which attempts to meet all the different requirements renders the housing component too expensive to produce. Realizing the device using a plurality of housing components makes it possible to eliminate these disadvantages, in particular in the case of complex devices such as, for example, inverters designed for operation outdoors. Conversely, however, stringent requirements have to be met both in respect of IP protection and in respect of reducing interference radiation between interconnected housing components. On the one hand, therefore, the IP-sealing action and the EMC shielding should be influenced as little as possible even if the boundary-surface distances fluctuate in relation to one another. At the same time, a corresponding seal should be easy to produce and should be capable of being installed straightforwardly in the device.

In the case of an electrical or electronic device which has a plurality of housing components, a seal of the type mentioned above is inserted, for example, between two boundary surfaces which are assigned to the respective housing components. In its installed state, the seal provides IP protection, and protects the interior of the device against the ingress of foreign bodies and/or water. Foreign bodies can be understood to mean, for example, particles of dust. It is likewise the case, however, that the protection against the ingress of foreign bodies also covers protection against contact, which prevents contact being made with live, or current-carrying, components in the interior of the device during operation of the latter. At the same time, however, a low-impedance electrical connection between the housing components means that this seal also provides an EMC-shielding action at the boundary surfaces of the relevant housing components. On the one hand, therefore, the seal reduces the amount of electromagnetic interference escaping from the interior of the device into the surroundings. On the other hand, it prevents the formation, between the housing components, of a potential difference which fluctuates over time, as a result of which the housing components would act as an antenna and would emit electromagnetic interference, in an undesirable manner, into the surroundings.

The IP code assigned to the IP (International Protection or also Ingress Protection) protection usually denotes the IP protection class—and, in addition, also a permitted area of use—of an electrical device. The IP code here is made up of two digits, of which the first classifies the protection against the ingress of a foreign body and the second classifies the protection against the ingress of water. In the case of both digits, the protective action increases in each case as the value of the digit increases.

Elastomer seals are known to provide the IP protection between housing components, said seals being installed between boundary surfaces of adjacent housing components and being compressed in their installed state. The elastic properties of the seals allow the latter to compensate for housing unevennesses up to a certain degree and the compression of the seals prevents dirt and/or water from penetrating into the interior of the device. However, such seals provide just an IP-sealing action, but not an EMC shielding action at the boundary surfaces.

As far as EMC shielding is concerned, on the other hand, it is known to use metallic contact springs. The contact springs can be mounted on a boundary surface of a housing component. In the installed state, when said housing component is connected to the other housing component, the contact springs provide one or more electrical contacts between the two housing components and thus reduce the amount of electromagnetic interference escaping from the device into the surroundings. A multiplicity of such contact springs are often mounted along a relevant boundary surface of a housing component. Such EMC shielding, however, does not provide any IP-sealing action for the interconnected housing components.

In addition, so-called combined seals (cf. for example, product overview flyer from Micro Tech Components GmbH, http://www.mtc.de/sites/default/files/linkables/flyer_ihv.pdf) are also known, and these provide both IP protection and EMC-shielding action in combination. Such a combined seal has a core material made of an elastomer, wherein the core material is sheathed to some extent by metal mesh or a metal foil. The elastic properties of the core material provides for the IP protection, while the outer metal mesh in contact with the metallic housing components, or the boundary surfaces thereof, provides an electrical connection between the boundary surfaces, and therefore the EMC-shielding action. However, the metal-mesh or metal-foil sheathing applied around the outside of the core reduces IP-sealing action of the core material, for which reason such as a seal is not designed to provide high-grade IP protection, in particular IP protection in classes IP-4X, IP-5X or IP-6X. In the case of the metal mesh, this is due to the fact that the metal mesh gives rise to additional unevennesses on the surface of the seals—at least over part of the surface of the seal. If part of the surface of the seal is sheathed with a metal foil, then, on account of the metal foil being less elastic, this part is not capable—or is at least is less capable—of compensating for unevennesses on the boundary surfaces, as a result of which the IP-sealing action of the combined seal is impaired. For a similar reason, such a combined seal is also capable only to a limited extent of compensating for fluctuations in the distance between the boundary surfaces and/or unevennesses in the boundary surfaces.

SUMMARY

It is the object of the disclosure to present a seal which is designed, in improved form, to provide both IP-sealing connection and EMC-shielding action between two housing components of an electrical or electronic device. In particular, the intention is for both the IP-sealing connection and the EMC-shielding action to be ensured to a great extent even if the distances between the housing components, or the boundary surfaces thereof, fluctuate in relation to one another and/or even if there are unevennesses in the boundary surfaces. The seal here should be capable of being produced as cost-effectively as possible and of being installed straightforwardly in the electrical or electronic device. It is a further object of the disclosure to present an electrical or electronic device comprising such a seal.

DESCRIPTION OF THE DISCLOSURE

A seal according to the disclosure for an IP-sealing and EMC-shielding connection between a first housing component and a second housing component of an electrical or electronic device comprises an elastomer-containing sealing body, and a metallic support that is embedded to some extent in the sealing body.

The seal is characterized in that the sealing body and the support are connected to one another in an adhesive and/or form-fitting manner, a material bond thus being formed. The support here has a plurality of metallic contact segments that project out of the sealing body. In an installed state, the seal is pressed in between a first boundary surface that is assigned to the first housing component, and a second boundary surface that is assigned to the second housing component. In the installed state, the metallic contact segments make electrical contact in resilient fashion with the metallic boundary surfaces of the two housing components.

The elastomer-containing sealing body here can be formed exclusively from the one elastomer. As an alternative, however, it is also possible for the sealing body to have a plurality of different materials, for example a plurality of different elastomers. If appropriate, the sealing body can also comprise, in addition to the one elastomer, a further plastic, which is not an elastomer. The fact that the support is embedded to some extent in the sealing body means, according to the disclosure, that there are also regions of the support which are not embedded in the sealing body and, for example, project out of the same. This is the case, for example, for the contact segments of the support. The sealing body, however, is present on both sides, in particular on a front side and a rear side, of the metallic support. Therefore, in the installed state, the sealing body is arranged between the support and the first boundary surface and also between the support and the second boundary surface. This means that the seal, in the installed state, ensures a high-grade IP-sealing connection between the two housing components, or the boundary surfaces thereof. On the other hand, the adjacent metallic boundary surfaces are connected electrically to one another via the resilient contact segments and, together with the support, between the boundary surfaces, they form a metallic shielding surface, which only has openings of which the extent is small enough for an escape of electromagnetic interference from the electrical or electronic device into the surroundings to be effectively reduced. It is not just the escape of electromagnetic interference from the interior of the device which is reduced here. Rather, there is also a reduction in an emission of electromagnetic interference which, in devices having a plurality of housing components which are not connected to one another with sufficiently low impedance, is caused on account of a voltage difference between the housing components fluctuating over time. In this case, the different housing components act more or less as an antenna for emitting the interference radiation. In the present disclosure, the adjacent metallic boundary surfaces—and thus the corresponding housing components—are connected electrically via a plurality of conductivity paths and with particularly low impedance. This prevents—or at least reduces—the occurrence of a voltage difference between the housing components which alters over time, as a result of which there is also an effective reduction in the emission of said electromagnetic interference. The electrical contact of the contact segments with the boundary surfaces does not take place at the location where the IP-sealing function is provided locally via the contact of the sealing body with the relevant boundary surface. Rather, the electrical contacts are spaced apart sufficiently from the contact of the boundary surface with the sealing body and therefore do not impair the IP-sealing action of the sealing body in relation to the boundary surface. In other words, there are boundary-surface regions which, in conjunction with the sealing body, merely provide the IP-sealing action. In this way, the seal according to the disclosure is capable of providing high-grade IP protection, in particular IP protection in classes IP-4X, IP-5X and IP-6X. At a distance from the regions which provide the IP-sealing action, there are regions which come into contact with the electrical contact segments of the seal according to the disclosure and via which the two boundary surfaces are connected electrically to one another. In this way, the seal provides EMC-shielding connection between the two boundary surfaces which, on account of the resiliently designed contact segments, also compensates for locally fluctuating distances between the boundary-surface regions with which contact is to be made—for example on account of dimensional tolerances, temperature change and/or unevennesses. The adhesive and/or form-fitting connection between the sealing body and the support, in the form of a material bond, means that the seal can be installed straightforwardly with the housing components of the device. In addition, production of the support and of the sealing body, as components of the seal, and also the assembly thereof can be easily automated, the overall result being a cost-effective seal.

It is generally possible for the seal to be formed by an open seal of which the shape is described geometrically by an open curve. In an advantageous embodiment, however, the geometrical curve describing a seal shape—and therefore also the seal itself—is continuous. In this case, the closed curve defines the circumference of a seal opening, wherein the seal opening may be, in principle, of any desired shape. For example, the seal opening—and therefore the seal—can be round, oval or polygonal.

In one embodiment, in the region embedded by the sealing body, the support has a planar portion. The contact segments here, which establish the electrical contact with the metallic boundary surfaces, are designed at an angle in relation to the planar portion. This gives rise, in conjunction with a suitable material of the metallic support, to the contact segments being of resilient quality, which, in the installed state of the seal, can compensate for distances between the boundary surfaces fluctuating in relation to one another, without the quality of an electrical connection between the boundary surfaces being affected.

In dependence on a planned installed state of the seal, it is possible, in one embodiment, for all the contact segments to adjoin the planar portion of the support along the same peripheral portion. For example, in the case of a round closed seal, all the contact segments are located either on an inner peripheral portion or on an outer peripheral portion of the support—and thus of the seal. In an alternative embodiment, all the contact segments are divided up into a first group of contact segments and a second group of contact segments. In this case, the two groups adjoin opposite peripheral portions of the planar portion, which is assigned to the support. With reference to the case mentioned above, for example the first group of contact segments is arranged on the outer peripheral portion, whereas the second group of contact segments is arranged on the inner peripheral portion of the planar portion, which is assigned to the support. As seen in relation to the closed seal, therefore, contact segments are located both in an inner region, and in an outer region, of the seal.

In dependence on the use, the contact segments that adjoin the planar portion, can be angled alternately to one another in different directions in relation to the planar portion. Therefore, for example the contact segments arranged along a certain peripheral portion of the support can be angled alternately to one another in different directions. As an alternative to this, it is also possible for the contact segments that adjoin one peripheral portion of the planar portion to be angled in one direction, whereas the contact segments that adjoin the opposite peripheral portion of the planar portion are angled in a different direction.

In one embodiment of the seal, the sealing body comprises two sub-bodies, which are arranged on opposite sides of the planar portion of the support. For example, a first sub-body is arranged on a front side of the support and a second sub-body is arranged on a rear side of the support. It is possible for the two sub-bodies to be formed separately and not to be connected to one another. As an alternative to this, however, it is also possible for the sealing body to be formed in a single piece and to cover, or even enclose, the planar portion both on the front side of the support and on the rear side of the support. In both embodiments, it is possible for the planar portion to have openings, through which the sealing body passes, or the sub-bodies of the sealing body pass. Such a form fit enhances a mechanical bond between the sealing body and the support and relative movement between the sealing body and support at the boundary surface thereof is effectively prevented, or at least reduced. As an alternative, or in addition, to this, it is also possible for the sealing body to be connected to the support in an adhesive manner, for example using a glue.

In an advantageous embodiment, the support is in the form of a punched and bent part. This means that the support, together with its angled contact segments, can be produced in large numbers and in an extremely cost-effective manner. The contact segments here are an integral part of the metallic support. In one embodiment, the two sub-bodies of the sealing body are formed by the elastomer being injection molded onto both sides of the support—i.e. front side and rear side. In an alternative embodiment, in which the sealing body is formed in a single piece, the sealing body has the metallic support encapsulated by the elastomer material. In both cases, however, the sealing body does not cover the entire support. Rather, the contact segments of the metallic support have regions which are not covered by the elastomer and, ultimately, serve to make the electrical contact with the metallic regions on the boundary surfaces of the housing components. It is also the case that the operation of forming the sealing body by injection molding the elastomer onto the support or by the latter being encapsulated by the elastomer can be carried out in a short period of time, and can be easily automated, as a result of which the seal can be produced in a cost-effective manner overall.

In one embodiment of the disclosure, the support is designed such that regions of contact to the contact segments with the boundary surfaces each run along a closed EMC shield ring, wherein, along the EMC shield ring, the distance between adjacent regions of contact is constant, but in particular does not exceed a distance-threshold value. The distance-threshold value here is dependent on the limit frequency up to which the EMC shielding is to take effect, and it decreases as the limit frequency increases. In a particularly advantageous embodiment of the seal, as is used, for example, for an electrical device in the form of a PWM-controlled inverter, the distance-threshold value, taking into account a conventional frequency of the associated semiconductor switch of approximately 50 kHz, is smaller than 5 mm.

In one embodiment of the seal, a material of the support is selected from the group spring steel, stainless steel, copper, aluminum, brass, bronze, copper-beryllium and a combination thereof. In a further embodiment, the elastomer of the sealing body is selected from the group silicone rubber (VMQ), acrylonitrile butadiene rubber (NBR), thermoplastic elastomer (TPE), ethylene propylene diene monomer rubber (EPDM), polyurethane rubber (PUR) and a combination thereof.

An electrical or electronic device according to the disclosure contains a first housing component and a second housing component, which is connected to the first housing component. Each of the housing components comprise a boundary surface, wherein the first housing component has a first boundary surface and the second housing component has a second boundary surface. In an assembled state of the housing components here, a seal according to the disclosure is arranged with IP-sealing and EMC-shielding action between the boundary surfaces of the housing components. In the installed state, the seal ensures that, on the one hand, the device, despite the plurality of housing components, has good electromagnetic compatibility and, on the other hand, the relevant housing components of the device are connected to one another with IP-sealing action. The two functions are realized on two adjacent boundary surfaces just using one component, namely the seal according to the disclosure forming a material bond. This gives rise to the advantages which have already been mentioned in conjunction with the seal. Since the device has a plurality of housing components, it is also possible for the process for producing the device to be rendered more efficient and cost-effective overall, since different housing components can be manufactured as it were in parallel. In addition, assembly of the housing components is straightforward since the seal, in the form of a composite component, can be fitted in a straightforward manner.

BRIEF DESCRIPTION OF THE FIGURES

The disclosure will be further explained, and described, hereinbelow with reference to preferred exemplary embodiments illustrated in the figures, in which:

FIG. 1a shows a first embodiment of a seal according to the disclosure;

FIG. 1b shows a detail-specific view of the metallic support of the seal from FIG. 1a;

FIG. 2 shows a second embodiment of a seal according to the disclosure;

FIG. 3 shows a third embodiment of a seal according to the disclosure;

FIG. 4a shows an electrical or electronic device having two housing components which are connected to one another with the interposition of a seal according to the disclosure.

DETAILED DESCRIPTION

Figure 1B:
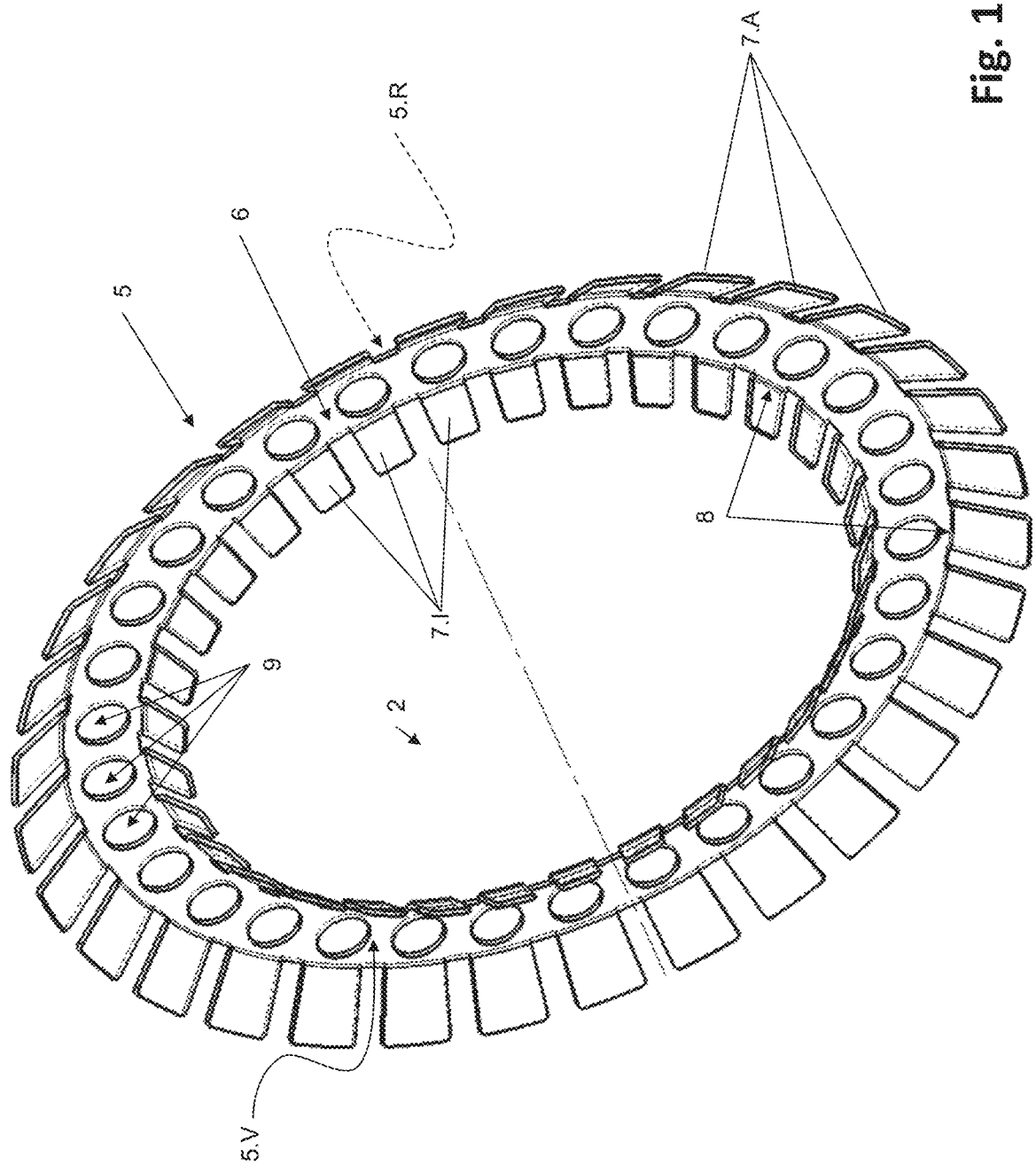

FIG. 1a shows a first embodiment of a seal 1 according to the disclosure. In the case illustrated, this is a seal 1 which is continuous, or is closed all the way round, and has a round seal opening 2. The seal 1 contains a sealing body 3, in which a metallic support 5 is embedded. In the case illustrated, the sealing body 3 is formed in one piece from an elastomer and has a round cross section. Within the context of the disclosure, however, it is also possible for the sealing body 3 to have a different cross section, for example a rectangular or a polygonal cross section, and/or to be formed in more than one piece, that is to say to comprise a plurality of non-interconnected sub-bodies on a front side 5.V of the support 5 and a rear side 5.R of the support 5. FIG. 1a illustrates the sealing body 3 in a partially transparent state, for which reason it is also possible to see details of the support in its embedded region. For the sake of clarity, however, the metallic support 5 is also illustrated separately, and in more detailed form, in FIG. 1b. The metallic support 5 is likewise continuous and has a planar portion 6, a multiplicity of angled contact segments 7.A, 7.I being connected to the peripheral portions thereof. The outer peripheral portion of the planar portion 6 is adjoined by a first group of contact segments 7.A, while a second group of contact segments 7.I adjoin the inner peripheral portion of the planar portion 6 of the support 5. All the contact segments 7.A, 7.I here are angled, by being bent along circumferentially oriented bending lines 8, in the same direction, in this case in the direction of a front side 5.V of the support 5. As an alternative to this, however, it is also possible for the contact segments 7.A, 7.I to be angled in different directions, for example for the outer contact segments 7.A to be angled in the direction of a front side 5.V, and for the inner contact segment 7.I to be angled in the direction of a rear side 5.R, of the metallic support 5. The planar portion 6 of the support 5 has a multiplicity of openings 9, through which the elastomeric sealing body 3 passes. The support 5 here is in the form of a punched and bent part, whereas, in the case illustrated, the sealing body 3 is formed by the support 5 being encapsulated by the elastomer.

FIG. 2 shows a second embodiment of the seal 1 according to the disclosure, which is designed in a manner similar to the seal 1 of the first embodiment illustrated in FIGS. 1a and 1 b. Therefore, it is only the differences of the second embodiment which will be discussed here, while reference is made to the description of FIGS. 1a and 1b for the rest of the aspects.

In contrast to FIGS. 1a and 1 b, the metallic support 5 of the seal 1 in the second embodiment has just one multiplicity of contact segments 7.A on the outer peripheral portion of its planar portion 6, whereas there is no contact segment adjoining the inner peripheral portion. The outer contact segments 7.A here are angled alternately to one another in different directions. The way in which the multiplicity of contact segments 7.A are angled relative to the planar portion 6 depends on the state in which the seal 1 is installed in each case in the electrical or electronic device (not illustrated here), and can be selected individually. As an alternative to bending along the circumferentially directed bending line 8, it is also possible for the individual contact segments 7.A to be rotated about an axis of rotation which runs through the center of the seal 1. This gives rise to fan-like angling of the contact segments 7.A. The same also applies to the inner contact segments 7.I from FIGS. 1a and 1 b.

FIG. 3 illustrates a cross-sectional view of a third embodiment of the seal 1 according to the disclosure. Here too, the seal 1 is constructed in a manner similar to the already described embodiments, for which reason reference is made to the descriptions above in respect of the same kinds of features. In contrast to the previous embodiments, the sealing body 3 of the seal 1 illustrated here is formed in two pieces. A first sub-body 3.1 with a quadrilateral cross section is arranged on the rear side 5.R of the support 5, whereas a second sub-body 3.2 with a likewise quadrilateral cross section is arranged on the front side 5.V of the support 5. As an alternative here, however, it is also possible for the sub-bodies 3.1, 3.2 to be of any other desired cross section, for example triangular or semicircular. In this embodiment, the planar portion 6 of the support 5 has no openings 9. The two sub-bodies 3.1, 3.2 of the sealing body 3 are formed separately here and are not interconnected. Each of the sub-bodies 3.1, 3.2 here is formed by elastomer being injection molded onto, or applied to, the respective side 5.R, 5.V of the support 5, or is connected adhesively to the support 5 in some other way. Although the embodiments of the seal 1 which are illustrated in FIGS. 1a, 1b, 2 and 3 are of a round and continuous shape, it is also possible, in principle, for the seal 1 to be oval, polygonal and/or open.

Figure 4B:
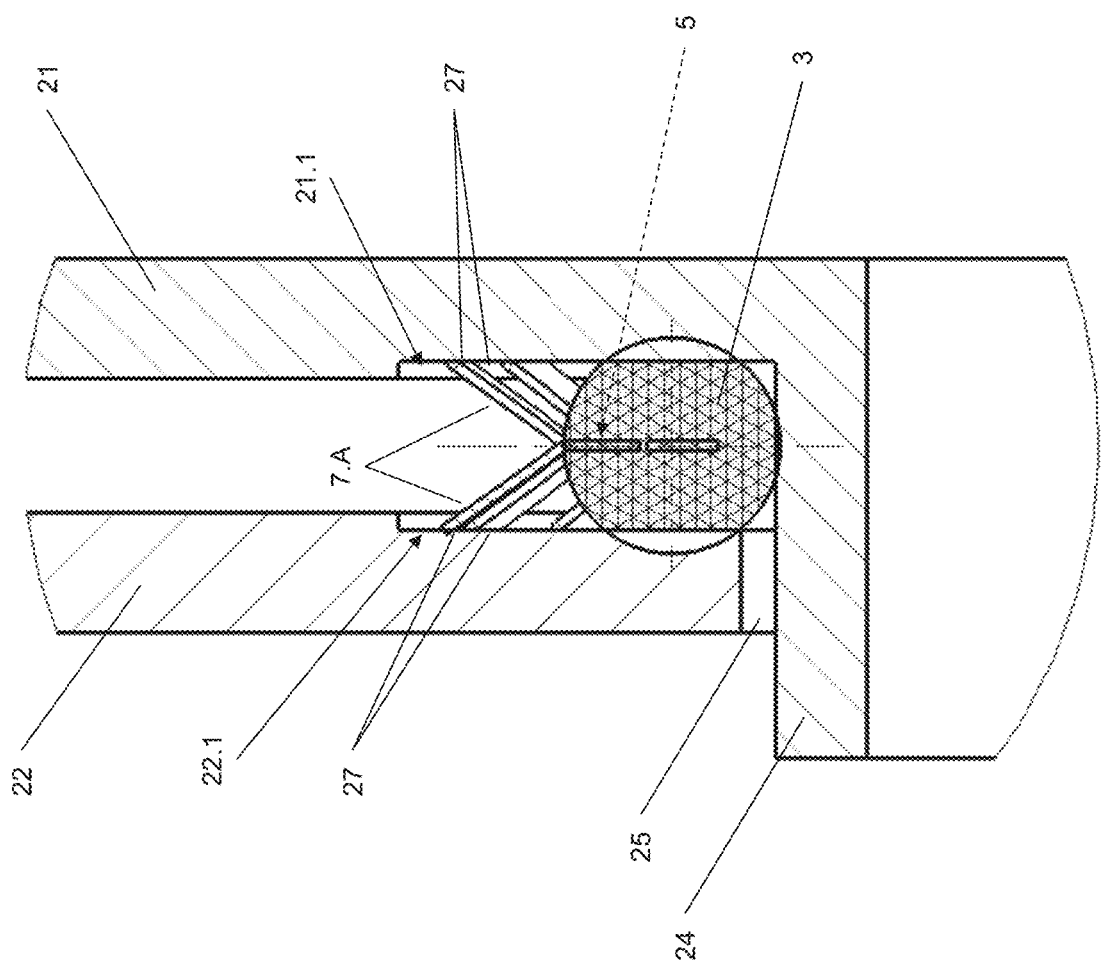
FIG. 4b shows a detail of the device from FIG. 4a in cross section, with the two housing components connected to one another with the interposition of a seal according to the disclosure.

FIG. 4a illustrates an exploded view of a plurality of housing components 21, 22 of an electrical or electronic device 20. During assembly of the device 20, a first housing component 21 is connected to a second housing component 22 with the interposition of one or more seals 1 according to the disclosure. The first housing component 21 here has a tubular extension 24, onto which the seal 1 is pushed, and thus fixed laterally, prior to the housing components 21, 22 being assembled. When the two housing components 21, 22 are joined together, the tubular extension 24 on the first housing component 21 passes through a corresponding through-passage bore 25 in the second housing component 22. This means that, in the definitively assembled state of the device 20, a through-passage is formed from the first housing component 21 into the second housing component 22. The through-passage can be used, for example, as a cable bushing between the two housing components 21, 22. The two housing components 21, 22 here are sealed relative to the surroundings of the device 20 by the seal 1 according to the disclosure. At the same time, during operation of the device 20, there is an effective reduction in the emission of electromagnetic interference from the device interior into the surroundings via the contact segments 7.A, 7.I of the seal 1 according to the disclosure. FIG. 4b gives even more detail on the function of the seal 1 according to the disclosure in respect of its EMC-shielding action at boundary surfaces of the two housing components 21, 22.

FIG. 4b shows a detail-specific view of the adjacent housing components 21, 22 in the assembled state at the location of the seal 1. The seal 1 is arranged on the tubular extension 24 between a first metallic boundary surface 21.1, which is assigned to the first housing component 21, and a second metallic boundary surface 22.1, which is assigned to the second housing component 22. The tubular extension 24 engages through a bore 25 in the second housing component 22. In the installed state, the seal 1 is compressed via the two boundary surfaces 21.1, 22.1. In this way, the interior of the device 20 is sealed in relation to the surroundings of the device 20. In the case illustrated, the seal 1 merely has contact segments 7.A along the outer peripheral portion of the planar portion 6, which is assigned to the support 5, and the seal therefore corresponds to the second embodiment according to FIG. 2. The contact segments 7.A here, which are angled alternately to one another in different directions, make contact with the metallic boundary surfaces 21.1, 22.1 at different regions of contact 27, as a result of which the metallic boundary surfaces 21.1, 22.1 of the adjacent housing components 21, 22 are connected electrically to one another via a multiplicity of different conductivity paths. A closed EMC shield ring is thus formed via the regions of contact 27 of the metallic boundary surfaces 21.1, 22.1 with the contact segments 7.A of the seal 1, in conjunction with the rest of the support 5. Suitable selection of the distance between adjacent contact segments 7.A, and thus between the corresponding regions of contact 27, makes it possible for the EMC-shielding action of the seal 1 to be coordinated individually with the electromagnetic frequencies which are to be shielded. The higher a frequency to be shielded, the smaller is the distance which should be selected between successive contact segments 7.A. In addition, it is likewise the case that the higher is the number of contact segments 7.A, and therefore of conductivity paths, between the boundary surfaces 22.1, 22.2, the lower is the impedance of the electrical connection between the two housing components 21, 22. At the same time, the resilient designed contact segments 7.A compensate for local fluctuations in the distance between the boundary surfaces, and local unevennesses of the respective boundary surfaces 21.1, 22.2, without the EMC shielding being significantly impaired.

The invention claimed is:

1. A seal for an International Protection (IP)-sealing and electromagnetic capability (EMC)-shielding connection between a first housing component and a second housing component of an electrical or electronic device, comprising:
    an elastomer-containing sealing body; and
    a metallic support that is embedded to some extent in the sealing body,
    wherein the sealing body and the metallic support are connected to one another in an adhesive and/or form-fitting manner and thus form a material bond,
    wherein the metallic support has a plurality of contact segments, which project out of the sealing body and are configured such that the contact segments make electrical contact in resilient fashion with a first boundary surface that is assigned to the first housing component, and a second boundary surface that is assigned to the second housing component, the seal being pressed in between said boundary surfaces in an installed state.

2. The seal as claimed in claim 1, wherein, in the embedded region, the metallic support has a planar portion, and wherein the contact segments are designed at a non-zero angle in relation to the planar portion.

3. The seal as claimed in claim 2, wherein all the contact segments adjoin the planar portion along an inner or outer peripheral portion of the planar portion.

4. The seal as claimed in claim 2, wherein the contact segments are divided up into a first group of contact segments and a second group of contact segments that adjoin the inner and outer peripheral portions of the planar portion, respectively.

5. The seal as claimed in claim 2, wherein the contact segments that adjoin the planar portion, are angled alternately to one another in different directions in relation to the planar portion.

6. The seal as claimed in claim 2, wherein the sealing body comprises a single-piece sealing body, or wherein the sealing body contains two sub-bodies that are arranged on opposite sides of the planar portion.

7. The seal as claimed in claim 1, wherein the seal is continuous and is round, oval or polygonal.

8. The seal as claimed in claim 1, wherein the planar portion has openings through which the sealing body passes.

9. The seal as claimed in claim 1, wherein regions of contact of the contact segments with the first and second boundary surfaces define a closed EMC shield ring, wherein, along the EMC shield ring, the distance between adjacent regions of contact is smaller than 5 mm.

10. The seal as claimed in claim 1, wherein the support is in the form of a punched and bent part.

11. The seal as claimed in claim 1, wherein the sealing body is formed by the elastomer being injection molded onto the support or by the sealing body being partially encapsulated by the elastomer.

12. The seal as claimed in claim 1, wherein the support comprises a material selected from the group spring steel, stainless steel, copper, aluminum, brass, bronze, copper-beryllium and a combination thereof.

13. The seal as claimed in claim 1, wherein an elastomer of the elastomer-containing sealing body is selected from the group silicone rubber (VMQ), acrylonitrile butadiene rubber (NBR), thermoplastic elastomer (TPE), ethylene propylene diene monomer rubber (EPDM), polyurethane rubber (PUR) and a combination thereof.

14. An electrical or electronic device having a first housing component comprising a first boundary surface, and a second housing component comprising a second boundary surface, wherein a seal is arranged with IP-sealing and EMC-shielding action between the boundary surfaces of the housing components, the seal comprising:
    an elastomer-containing sealing body; and
    a metallic support that is embedded to some extent in the sealing body,
    wherein the sealing body and the metallic support are connected to one another in an adhesive and/or form-fitting manner and thus form a material bond,
    wherein the metallic support has a plurality of contact segments, which project out of the sealing body and are configured such that the contact segments make electrical contact in resilient fashion with the first boundary surface that is assigned to the first housing component, and the second boundary surface that is assigned to the second housing component, the seal being pressed in between said boundary surfaces in an installed state.

* * * * *